US009990813B2

(12) United States Patent
Thiel

(10) Patent No.: US 9,990,813 B2
(45) Date of Patent: Jun. 5, 2018

(54) COMBINATION SIGNAL MARKER PANEL AND SOLAR PANEL

(71) Applicant: LAT Enterprises, Inc., Raleigh, NC (US)

(72) Inventor: Laura Thiel, Raleigh, NC (US)

(73) Assignee: LAT ENTERPRISES, INC., Raleigh, NC (US)

( * ) Notice: Subject to any disclaimer, the term of this patent is extended or adjusted under 35 U.S.C. 154(b) by 0 days. days.

(21) Appl. No.: 15/390,802

(22) Filed: Dec. 27, 2016

(65) Prior Publication Data
US 2017/0109978 A1 Apr. 20, 2017

Related U.S. Application Data

(63) Continuation-in-part of application No. 14/156,094, filed on Jan. 15, 2014.

(51) Int. Cl.
| | |
|---|---|
| *H01L 31/042* | (2014.01) |
| *G08B 5/00* | (2006.01) |
| *H02S 30/20* | (2014.01) |
| *H02S 40/36* | (2014.01) |
| *H02S 99/00* | (2014.01) |
| *H01L 31/048* | (2014.01) |

(52) U.S. Cl.
CPC .............. *G08B 5/002* (2013.01); *H02S 30/20* (2014.12); *H02S 40/36* (2014.12); *H02S 99/00* (2013.01); *G08B 5/00* (2013.01); *H01L 31/042* (2013.01); *H01L 31/048* (2013.01); *Y02E 10/50* (2013.01)

(58) Field of Classification Search
CPC ..... H01L 31/042; H01L 31/048; H02S 30/20; H02S 40/36; H02S 99/00; G08B 5/00; G08B 5/002; Y02E 10/50
USPC ..... 116/2, 28 R, 63 P, 173–175, 209; 40/610
See application file for complete search history.

(56) References Cited

U.S. PATENT DOCUMENTS

| | | | |
|---|---|---|---|
| 3,952,694 A | 4/1976 | McDonald | |
| 4,080,677 A | 3/1978 | Koehler | |
| 4,656,770 A * | 4/1987 | Nuttle | A01M 29/08 116/22 A |
| 4,872,414 A | 10/1989 | Asquith | |
| 5,185,042 A | 2/1993 | Ferguson | |
| 5,245,943 A | 9/1993 | Hull et al. | |
| 5,326,297 A | 7/1994 | Loughlin | |
| 5,421,287 A | 6/1995 | Yonover | |
| 5,736,954 A | 4/1998 | Veazey | |
| 6,239,701 B1 | 5/2001 | Vasquez et al. | |
| 6,313,396 B1 | 11/2001 | Glenn | |
| 6,351,908 B1 * | 3/2002 | Thomas | A01M 29/06 116/22 A |

(Continued)

*Primary Examiner* — R. A. Smith
*Assistant Examiner* — Tania Courson
(74) *Attorney, Agent, or Firm* — NEO IP

(57) ABSTRACT

A combination signal marker panel and solar panel and methods are disclosed. The combination signal marker panel and solar panel includes a signal marker that is detachably fastened to a flexible solar panel. The solar panel is modular and configurable to provide any output voltage. Namely, the solar panel can include any number of solar modules configured in series, configured in parallel, or configured in any combination of series and parallel arrangements. The combination signal marker panel and solar panel can be used to harvest solar energy while simultaneously marking the user's position.

15 Claims, 18 Drawing Sheets

(56) References Cited

U.S. PATENT DOCUMENTS

| | | |
|---|---|---|
| 6,415,734 B1 | 7/2002 | LaPuzza |
| 7,695,334 B2 | 4/2010 | Yonover et al. |
| 7,798,090 B2 | 9/2010 | Hatfield |
| 7,878,678 B1 | 2/2011 | Stamatatos |
| 8,258,394 B2* | 9/2012 | Baruh ............... B63H 9/04 |
| | | 136/245 |
| 8,832,981 B2 | 9/2014 | Desaulniers |
| 8,945,328 B2 | 2/2015 | Longinotti-Buitoni et al. |
| 9,709,362 B2* | 7/2017 | Shelley ............ A41D 29/00 |
| 9,780,344 B2* | 10/2017 | Thiel ............... H01M 2/1061 |
| 2005/0210722 A1 | 9/2005 | Graef et al. |
| 2008/0190476 A1* | 8/2008 | Baruh ............... B63H 9/04 |
| | | 136/245 |
| 2008/0223428 A1* | 9/2008 | Zeira ............... H01L 51/0005 |
| | | 136/244 |
| 2008/0223431 A1* | 9/2008 | Chu ................. H02S 30/20 |
| | | 136/245 |
| 2009/0164174 A1* | 6/2009 | Bears ............... G01D 4/00 |
| | | 702/188 |
| 2009/0229655 A1* | 9/2009 | Lee ................. H01L 31/048 |
| | | 136/251 |
| 2011/0100425 A1* | 5/2011 | Osamura ........... H01L 31/048 |
| | | 136/246 |
| 2011/0290683 A1* | 12/2011 | High ............... G09F 17/00 |
| | | 206/315.7 |
| 2013/0049991 A1 | 2/2013 | Mothaffar |
| 2013/0263922 A1* | 10/2013 | Jung ............... H01L 31/0487 |
| | | 136/256 |
| 2015/0128845 A1 | 5/2015 | Desaulniers |
| 2016/0112004 A1* | 4/2016 | Thiel ............... H02S 40/42 |
| | | 136/246 |
| 2017/0229692 A1* | 8/2017 | Thiel ............... H01M 2/1094 |

\* cited by examiner

COMBINATION SIGNAL MARKER PANEL AND SOLAR PANEL

CROSS REFERENCE TO RELATED APPLICATIONS

This application is related to and claims priority from the following US patent applications. This application is a continuation-in-part of U.S. application Ser. No. 14/156,094, filed Jan. 15, 2014, which is incorporated herein by reference in its entirety.

BACKGROUND OF THE INVENTION

1. Field of Invention

The present invention relates generally to portable equipment for military, aviation, personal survival, hiking, boating, and camping applications and, more particularly, to a combination signal marker panel and solar panel.

2. Description of Related Art

Certain distress signals are used in, for example, military applications, aviation applications, wilderness and personal survival applications, hiking and camping applications, boating applications, and disaster relief efforts. One example of a distress signal is a signal marker panel (sometimes called a rescue marker panel). In military applications, the signal marker panel often is laid out on the ground to identify troop positions to friendly aircraft, or to identify where help is needed. In any of the aforementioned applications, signal marker panels can be used when search aircraft are in use. A signal marker panel typically is formed of a durable, lightweight, and foldable fabric that has a highly visible color, such as red, orange, pink, yellow, or white.

For example, in military applications, separate signal marker panels and solar panels have been used independently of one another, although often at the same time and at the same location. Soldiers often carry 60-100 lbs. of gear, including body armor, weapons, ammunition, water, food, radios, and batteries. Carrying multiple pieces of equipment, such as a separate marker panel and solar panel, means added weight and bulk, as well as multiple pieces of equipment to keep track of and maintain. Further, conventional substrates used in solar panels tend to be heavy and rigid, which does not lend well to portability.

Examples of relevant prior art documents include the following:

U.S. Pat. No. 4,872,414 for "Emergency signal balloon apparatus" by inventors Asquith et al., filed Jun. 8, 1988 and issued Oct. 10, 1989, is directed to an emergency signal balloon apparatus having a helium canister, an emergency signal balloon, a predetermined length of tether line, a valve assembly and a two part canister housing within which all of the components can be carried. The balloon is constructed of ultra-light, high-strength material, such as Mylar, and most of it would have an iridescent color, such as hunter's orange, with the upper portion having large wedged shaped sections of a highly reflective silver material. The balloon would further have large black letters, "CALL 911" which is the universal distress telephone number. Each of the letters of the message is bordered with highly reflective material so that when light strikes the material at night the message is clearly reflected and is highly visible.

U.S. Pat. No. 5,736,954 for "Parafoil-borne distress signals" by inventor Veazey, filed Mar. 4, 1996 and issued Apr. 7, 1998, is directed to distress signal kits comprising a parafoil for carrying aloft various emergency or distress signals such as radar reflective materials, lights, flares, distress flags or smoke signals. Preferably the parafoil itself is colored International orange and contains a U.S. Coast Guard-approved distress signal (black square and circle) on both top and bottom surfaces. The parafoil can be used to raise a spinnaker sail attached to a vessel or swimmer. The spinnaker can also carry radar reflective components and/or distress flags, and can be fitted for other survival uses.

U.S. Pat. No. 6,313,396 for "Lightweight solar module and method of fabrication" by inventor Glenn, filed May 22, 2000 and issued Nov. 6, 2001, is directed to a solar cell module comprising a substrate and a first solar cell supported by the substrate, with the first solar cell having a first top side and a first rear side. A second solar cell is supported by the substrate and has a second top side and a second rear side, with the second solar cell being operatively adjacent the first solar cell. A first tab is affixed to either the first or second top side and operatively interfaces with a respective one of the first or second rear side. A bonding element is disposed between the substrate and first and second rear sides. The bonding element directly bonds (a) the substrate to one of the first and second rear sides and (b) the substrate to the tab. A first metal trace element is disposed between the substrate and first and second solar cells, with the metal trace electrically connecting one of the first and second top sides to one of the first and second rear sides with a conducting element.

U.S. Pat. No. 7,695,334 for "Water-activated and light-assisted visual locating device" by inventors Yonover et al., filed Jul. 17, 2007 and issued Apr. 13, 2010, is directed to a visual locating device comprising an elongate, inherently buoyant, flexible sheet for floating on the surface of a body of water that has a longitudinal axis. At least three buoyant support struts are secured to the sheet and disposed across the longitudinal axis of the sheet such that the sheet is divided into a plurality of sections defined between respective pairs of struts. A light source is disposed on the sheet to provide nighttime visibility to the sheet. A pouch, which receives the sheet when stowed, is configured to release the sheet when immersed in water. The sheet is at least z-folded inside the pouch.

U.S. Pat. No. 8,832,981 for "Rescue locator signal" by inventor Desaulniers, filed Apr. 18, 2011 and granted Sep. 16, 2014, is directed to a rescue locator signal that includes a central member with a first arm extending therefrom in a first direction. A second arm extends from the central member in a second direction that is completely opposite to the first direction, and a third arm extends from the central member in a third direction. A fourth arm extends from the central member in a fourth direction that is completely opposite to the third direction. A plurality of reflective members are located on upper surfaces of the first arm, second arm, third arm, and fourth arm.

SUMMARY OF THE INVENTION

The present invention provides a combination signal marker panel and solar panel comprising a signal marker panel and a solar panel, wherein the solar panel comprises one or more solar modules, wherein the one or more solar modules are mounted to a flexible substrate and are electrically connected to one another and to at least one output connector, wherein the flexible substrate comprises flashspun high-density polyethylene, and wherein the signal marker panel is detachably secured to and separable from the solar panel.

These and other aspects of the present invention will become apparent to those skilled in the art after a reading of the following description of the preferred embodiment when considered with the drawings, as they support the claimed invention.

DETAILED DESCRIPTION

Figure 1:
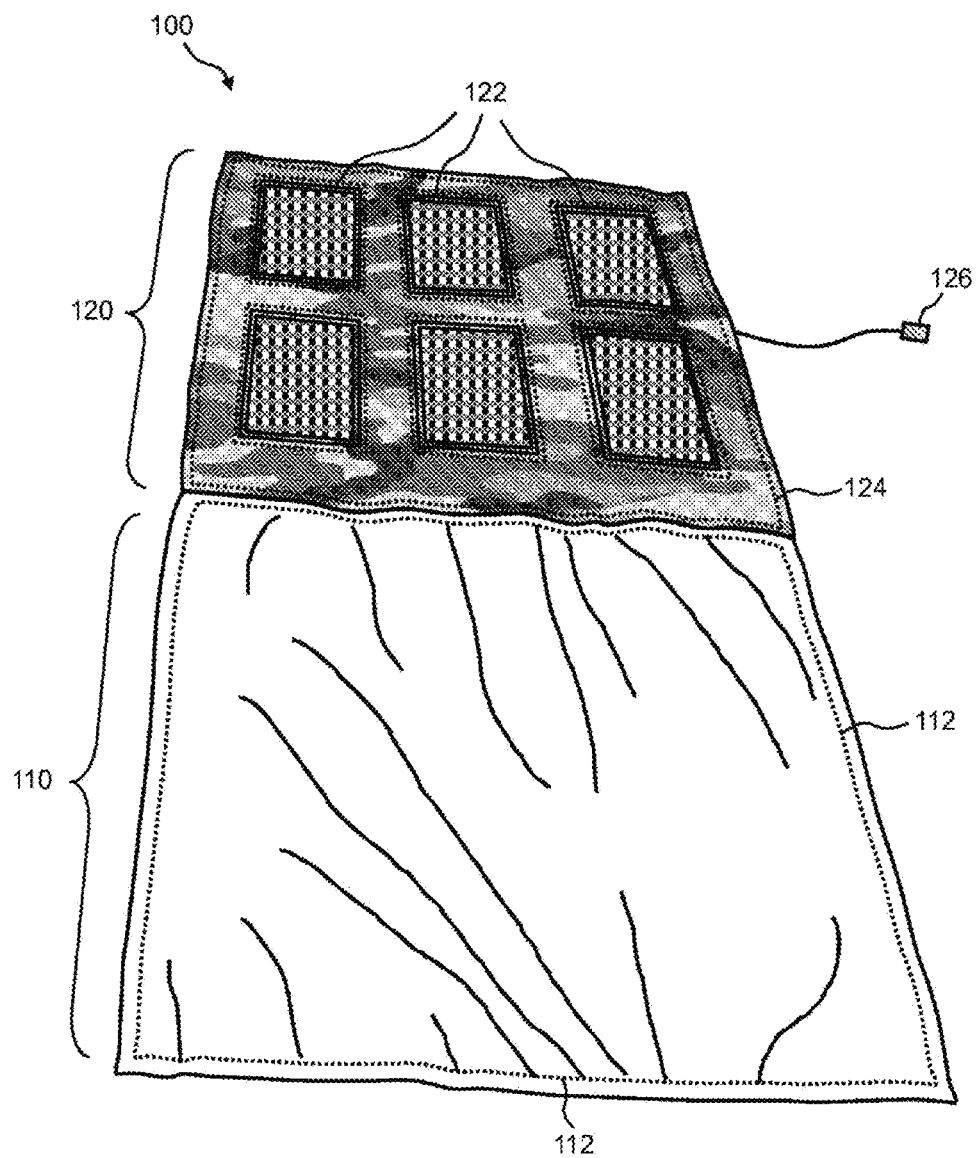
FIG. 1 illustrates a front view of a combination signal marker panel and solar panel according to one embodiment of the present invention.

Referring now to the drawings in general, the illustrations are for the purpose of describing preferred embodiment(s) of the invention at this time, and are not intended to limit the invention thereto. Any and all text associated with the figures as illustrated is hereby incorporated by reference in this detailed description.

Conventional signal marker panels and solar panels typically are provided separately and used independently of one another. In contrast, the presently disclosed subject matter provides a combination signal marker panel and solar panel. Namely, in the combination signal marker panel and solar panel, a signal marker is detachably secured to a flexible solar panel. The presently disclosed combination signal marker panel and solar panel is lightweight, flexible (i.e., foldable or rollable), and waterproof or water resistant. As a result, the combination signal marker panel and solar panel is well-suited for portability and for use in adverse conditions.

An aspect of the presently disclosed combination signal marker panel and solar panel is that both the signal marker panel and the solar panel fulfill their traditional functions unhindered. The signal marker panel and the solar panel can be used simultaneously, or the signal marker panel can be used alone, or the solar panel can be used alone.

Yet another aspect of the presently disclosed combination signal marker panel and solar panel is that the solar panel is modular and configurable to provide any output voltage. The solar panel can include any number of solar modules configured in series, configured in parallel, or configured in any combination of series and parallel arrangements.

In one embodiment of the present invention, the substrate of the solar panel is formed of a lightweight, flexible (i.e., foldable or rollable), printable, and waterproof or water resistant material. In one embodiment, the material is polyethylene, for example, a flashspun high-density polyethylene such as DuPont™ Tyvek® material. The electrical traces for electrically connecting any configuration of solar modules can be easily printed on the flashspun high-density polyethylene substrate using, for example, electrically conductive ink. A flashspun high-density polyethylene substrate is also flexible, such that it can be folded and stowed for storage, and tear resistant. Because a flashspun high-density polyethylene substrate of the solar panel is printable, assembly instructions and/or any other markings can be printed thereon for assisting the assembly of the solar modules on the substrate.

In one embodiment of the present invention, the signal marker panel can be positioned to provide secondary protection to the solar panel, and solar modules thereof, when folded up and stowed.

Another aspect of the presently disclosed combination signal marker panel and solar panel is that the output voltage of the solar panel is provided in an unregulated state. As a result, the complexity of the solar panel is reduced as compared with conventional solar panels because it does not include voltage conditioning circuitry at its output.

Figure 2:
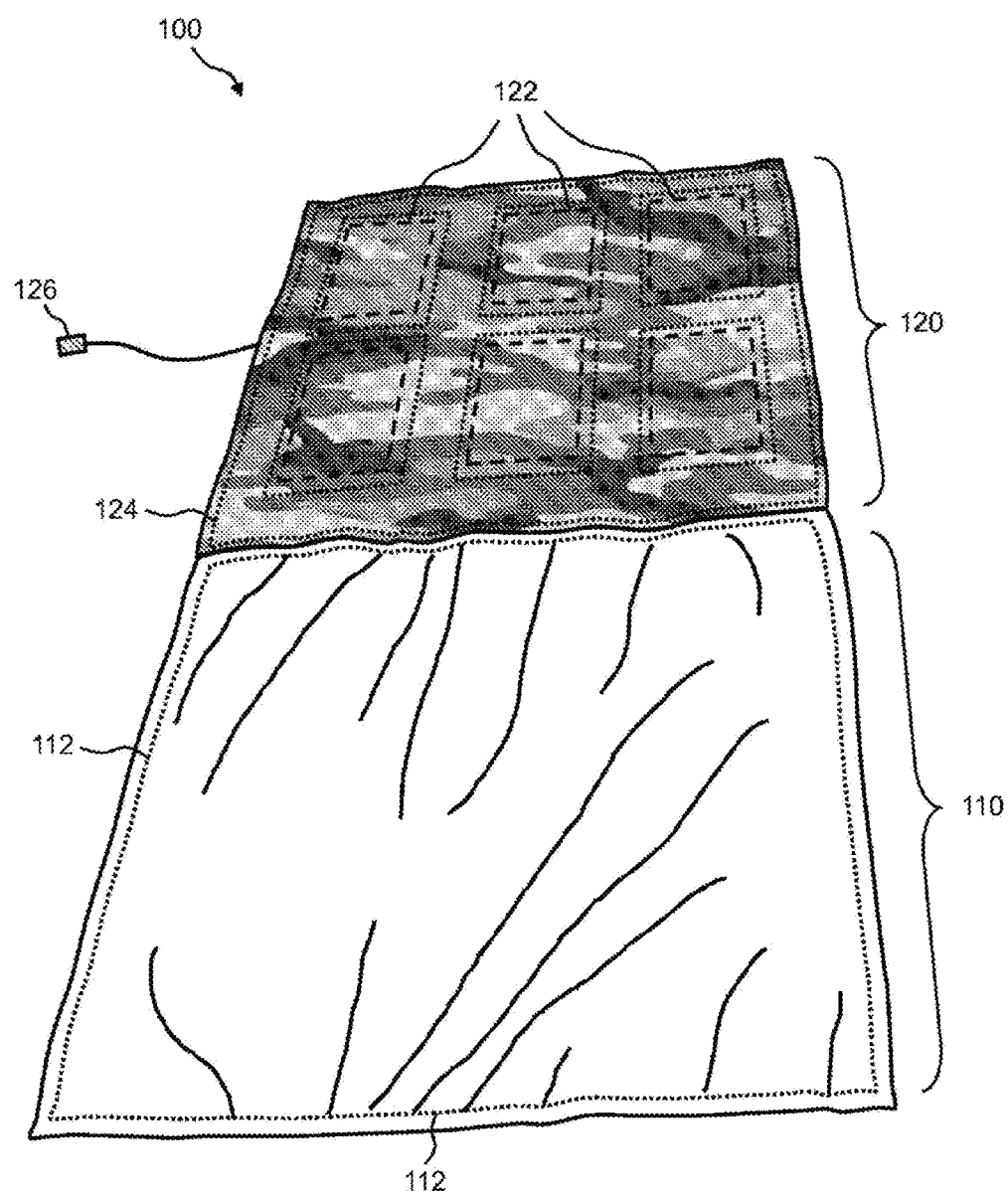
FIG. 2 illustrates a rear view of a combination signal marker panel and solar panel according to one embodiment of the present invention.

FIG. 1 and FIG. 2 illustrate front and rear perspective views, respectively, of an example of the presently disclosed combination signal marker panel and solar panel 100 that is lightweight, foldable, waterproof or water resistant, and well-suited for portability. The combination signal marker panel and solar panel 100 includes a signal marker panel 110 that is detachably secured to a solar panel 120.

The signal marker panel 110 of the combination signal marker panel and solar panel 100 can be formed of any flexible, durable, and waterproof or water resistant material used in conventional signal marker panels. For example, the signal marker panel 110 can be formed of polyester, polyvinyl chloride (PVC)-coated polyester, vinyl-coated polyester, nylon, canvas, PVC-coated canvas, or polycotton canvas. The signal marker panel 110 can be any color suitable for signaling, such as, but not limited to, red, orange, yellow, pink, and white. The signal marker panel 110 includes a U.S. Coast Guard-approved distress signal (e.g., a black square and circle) on the top and/or bottom surface in one embodiment of the present invention. In another embodiment, the signal marker panel 110 incorporates reflective material and/or thermal identification material on the top and/or bottom surface. A hem 112 is provided around the perimeter of the signal marker panel 110 in this embodiment of the present invention.

In one embodiment, the solar panel 120 and/or the signal marker panel 110 include tie straps, loops, eyelets, and/or grommets. The tie straps, loops, eyelets, and/or grommets allow the solar panel 120 and/or signal marker panel 110 to attach to different surfaces (e.g., the ground, trees, or a backpack). In one embodiment, tie straps are made of the same material as the signal marker panel 110, nylon, elastic, or parachute cord. The solar panel 120 and/or signal marker panel 110 may be attached to the ground with stakes through the eyelets, grommets, and/or loops.

In another embodiment, the signal marker panel 110 includes snaps, allowing multiple signal marker panels 110 to be connected together.

The signal marker panel is preferably a single layer of lightweight fabric, which reduces the overall weight of the combination signal marker panel and solar panel.

In an alternative embodiment, the signal marker panel has two layers. One layer can be any color suitable for signaling, such as, but not limited to, red, orange, yellow, pink, and white. The other layer can be a different color or a pattern (e.g., camouflage).

In one embodiment, the solar panel 120 of the combination signal marker panel and solar panel 100 is a multilayer structure that includes a plurality, e.g., one or more, of solar modules 122 mounted on a flexible substrate, wherein the flexible substrate with the plurality of solar modules 122 is sandwiched between two layers of waterproof or water resistant fabric. In one embodiment, openings, e.g., windows, are formed in at least one of the two layers of fabric for exposing the solar modules 122. The outer two layers of fabric can be any color or pattern. In the example shown in FIG. 1 and FIG. 2, the outer two layers of fabric have a camouflage pattern thereon. One of ordinary skill in the art would recognize that the two layers of fabric can have any camouflage pattern including, but not limited to, Universal Camouflage Pattern (UCP) or ACUPAT; UCP-Delta; Operation Enduring Freedom Camouflage Pattern (OCP) or MultiCam; Airman Battle Uniform (ABU); Navy Working Uniform (NWU); MARPAT (desert and woodlands); Disruptive Overwhite Snow digital camouflage; and Tactical Assault Camouflage or TACAM.

A hem 124 is provided around the perimeter of the solar panel 120 in one embodiment. The output of any arrangement of solar modules 122 in the solar panel 120 is a direct current (DC) voltage. Accordingly, the solar panel 120 includes at least one output connector 126 that is wired to the arrangement of solar modules 122. The at least one output connector 126 is used for connecting any type of DC load to the solar panel 120. In one example, the solar panel 120 is used for supplying power to a device, such as a DC-powered radio. In another example, the solar panel 120 is used for charging a battery.

The length of the signal marker panel 110 can be about the same or can be different than the width. The footprint of the signal marker panel 110 can be, for example, square or rectangular. The length and width of the signal marker panel 110 can be, for example, from about 8 inches to about 48 inches. In one example, the signal marker panel 110 is about 36×36 inches.

Similarly, the length of the solar panel 120 can be about the same or can be different than the width. The footprint of the solar panel 120 can be, for example, square or rectangular. The length and width of the solar panel 120 can be, for example, from about 8 inches to about 48 inches. In one example, the solar panel 120 is about 36×36 inches.

Figure 3A:
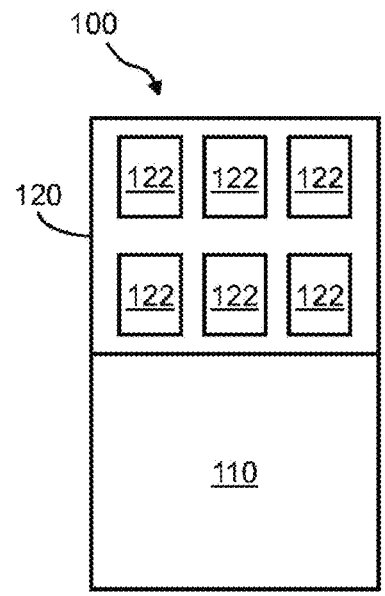
FIG. 3A illustrates a plan view of a configuration of one embodiment of the combination signal marker panel and solar panel according to one embodiment of the present invention.
Figure 3B:
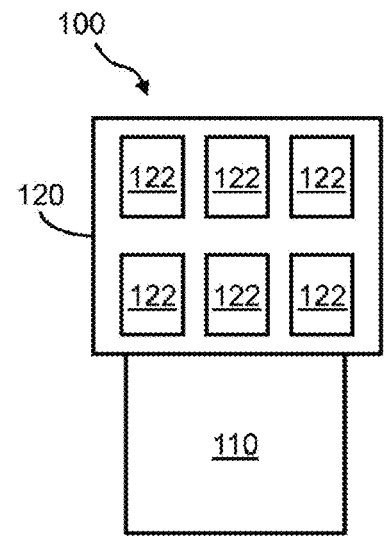
FIG. 3B illustrates a plan view of a configuration of another embodiment of the combination signal marker panel and solar panel according to one embodiment of the present invention.
Figure 3C:
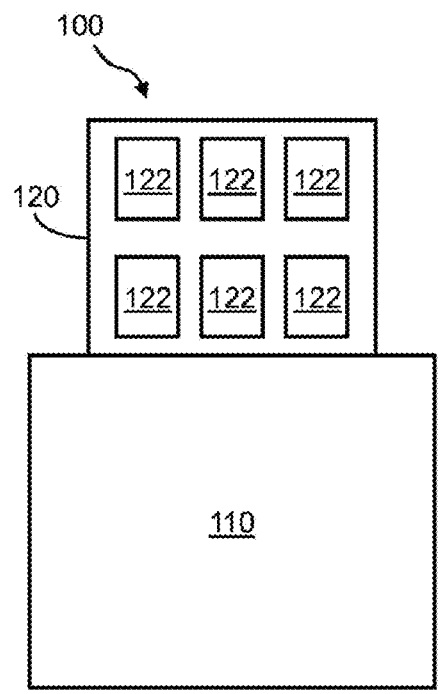
FIG. 3C illustrates a plan view of a configuration of yet another embodiment of the combination signal marker panel and solar panel according to one embodiment of the present invention.

The signal marker panel 110 and the solar panel 120 can be substantially the same size or can be different sizes and still be joined together. For example, FIG. 1, FIG. 2, and FIG. 3A show an example of the combination signal marker panel and solar panel 100 wherein the signal marker panel 110 and the solar panel 120 are substantially the same size. FIG. 3B, however, shows an example of the combination signal marker panel and solar panel 100 wherein a smaller signal marker panel 110 is joined to a larger solar panel 120. Further, FIG. 3C shows an example of the combination signal marker panel and solar panel 100 wherein a larger signal marker panel 110 is joined to a smaller solar panel 120.

In one embodiment of the combination signal marker panel and solar panel 100, one edge of the signal marker panel 110 is sewed, adhered, or otherwise fastened to one edge of the solar panel 120 in a substantially permanent fashion. In another embodiment, however, the signal marker panel 110 can be detachable from the solar panel 120. For example, one edge of the signal marker panel 110 can be fastened to one edge of the solar panel 120 using a zipper, an arrangement of buttons or snaps, ties, or a hook-and-loop fastener system.

The hook-and-loop fastener system can comprise a first strip comprising hooks and a second strip comprising loops. The first strip and the second strip are adhered, e.g., glued, sewn, or otherwise attached, to opposing surfaces to be fastened. For example, in some embodiments, the first strip comprising hooks is attached to the signal marker panel 110 and the second strip comprising loops is attached to the solar panel 120. In other embodiments, the first strip comprising hooks is attached to the solar panel 120 and the second strip comprising loops is attached to the signal marker panel 110. When the first strip and the second strip are pressed together, the hooks catch in the loops and the two strips reversibly bind or fasten. The two strips can be separated by pulling apart.

The hook-and-loop fastener system can be made of any appropriate material known in the art including, but not limited to, nylon, polyester, Teflon®, and the like. Velcro® is an example of a hook-and-loop fabric fastener system.

The solar panel 120 of the combination signal marker panel and solar panel 100 is modular and configurable to provide any output voltage. While FIG. 1 through FIG. 3C show six solar modules 122 in the solar panel 120, this is exemplary only. The solar panel 120 can include any number of solar modules 122 configured in series, configured in parallel, or configured in any combination of series and parallel arrangements. In particular, the configuration of solar modules 122 in the solar panel 120 can be tailored in any way to provide a certain output voltage and current. More details of the solar panel 120 of the combination signal marker panel and solar panel 100 are shown and described herein below with reference to FIG. 4 through FIG. 7. Additionally, example configurations of solar modules 122 are shown and described herein below with reference to FIG. 10, FIG. 11, FIG. 12, and FIG. 13.

Figure 4:
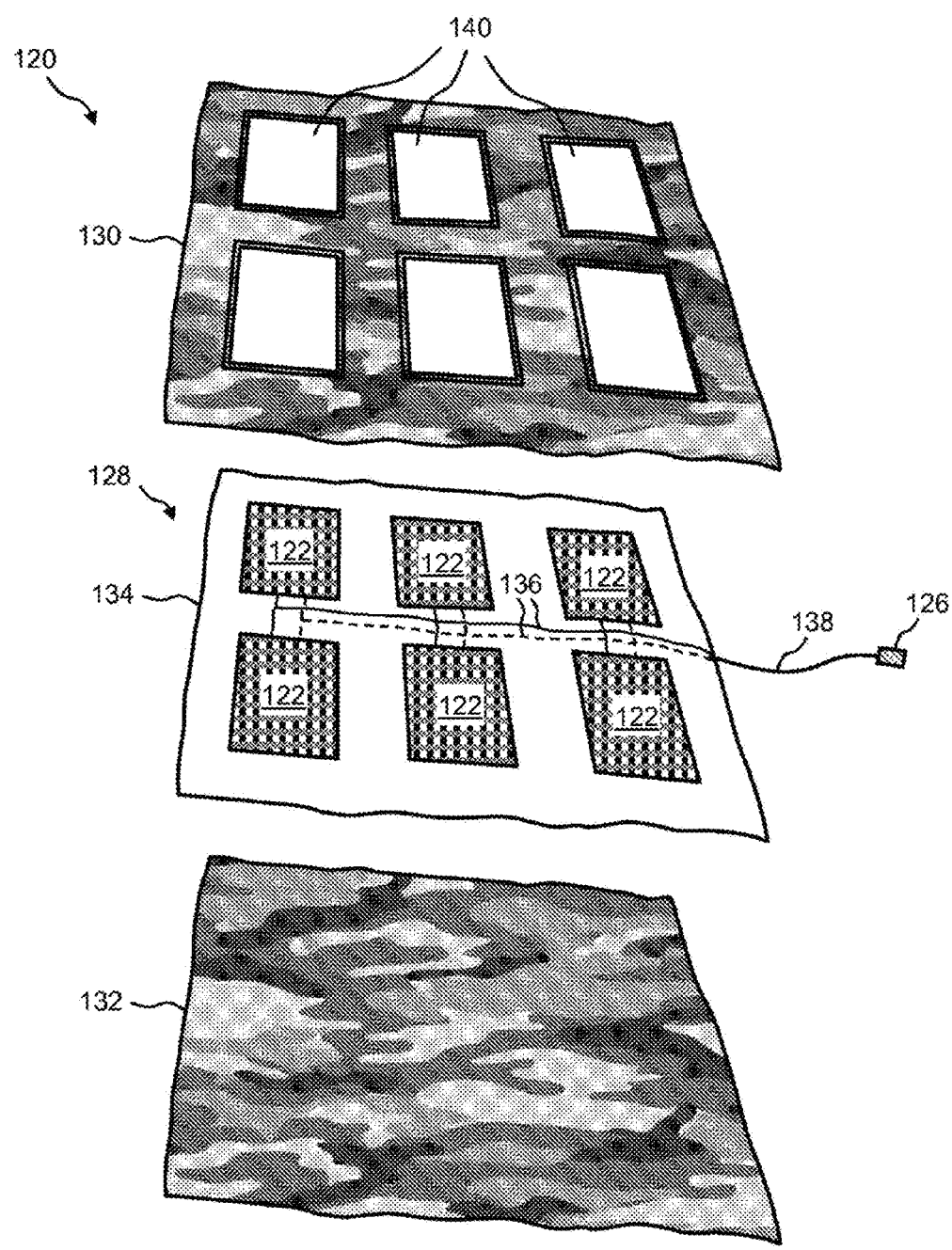
FIG. 4 illustrates an exploded view of one embodiment of the solar panel of the combination signal marker panel and solar panel.

FIG. 4 illustrates an exploded view of the solar panel 120 of one embodiment of the presently disclosed combination signal marker panel and solar panel 100, wherein the solar panel 120 comprises a multilayer structure. Namely, the solar panel 120 includes a solar panel assembly 128 that is sandwiched between a first fabric layer 130 and a second fabric layer 132. The first fabric layer 130, the solar panel assembly 128, and the second fabric layer 132 are intimately adhered together using a hook-and-loop system and/or stitching. In one embodiment, stitching passes through all of the layers of the solar panel 120 (i.e., through the first fabric layer 130, the flexible substrate 134, and the second fabric layer 132). In another embodiment, a hook-and-loop system is used to secure the edges of the first fabric layer 130 around the edges of the solar modules 122. The flexible substrate 134 is secured to the second fabric layer 132 using a hook-and-loop system and/or stitching.

The first fabric layer 130 and the second fabric layer 132 can be formed of any flexible, durable, and waterproof or water resistant material, such as but not limited to, polyester, PVC-coated polyester, vinyl-coated polyester, nylon, canvas, PVC-coated canvas, and polycotton canvas. The first fabric layer 130 and the second fabric layer 132 can be any color or pattern, such as the camouflage pattern shown in FIG. 4. Additionally, the first fabric layer 130 and the second fabric layer 132 can be the same color or pattern or can be different colors or patterns.

The solar panel assembly 128 of the solar panel 120 includes the plurality of solar modules 122 mounted on a flexible substrate 134. Materials for forming the solar modules 122 include, but are not limited to, amorphous silicon, copper indium gallium (di)selenide (CIGS), and thin film crystals grown in outer space, such as the crystals used in solar cells of space stations, space shuttles, and satellites. The size of the solar modules 122 can be, for example, from about 1 inch to about 48 inches on a side. In one example, each solar module 122 is about 3 inches by about 6 inches.

A set of windows or openings 140 is provided in the first fabric layer 130 for exposing the faces of the solar modules 122. The sizes and positions of the windows or openings 140 in the first fabric layer 130 substantially correspond to the sizes and positions of the solar modules 122 on the flexible substrate 134.

The flexible substrate 134 is formed of a material that is lightweight, flexible (i.e., foldable or rollable), and waterproof or water resistant. In one embodiment, the flexible substrate 134 is formed of a flashspun high-density polyethylene such as Dupont™ Tyvek® material. The solar modules 122 can be mounted on the flexible substrate 134 using, for example, an adhesive. When the solar panel 120 is assembled, the solar panel assembly 128 is substantially hidden from view between the first fabric layer 130 and the second fabric layer 132, except for the faces of the solar modules 122 showing through the windows or openings 140.

Wherein flashspun high-density polyethylene is conventionally used as a vapor barrier material in weatherization systems in buildings, one aspect of the presently disclosed combination signal marker panel and solar panel 100 is the use of flashspun high-density polyethylene material as a substrate for electronics in a flexible panel (i.e., the solar panel 120). A pattern of wiring traces 136 for electrically connecting any configuration of solar modules 122 can be easily printed on the flashspun high-density polyethylene substrate using, for example, electrically conductive ink, while at the same time the flashspun high-density polyethylene substrate is flexible such that it can be folded and provides a layer of water barrier to protect the solar modules 122.

One end of a cable or wire 138 is electrically connected to the wiring traces 136, while the at least one connector 126 is on the opposite end of the cable or wire 138. The at least one connector 126 can be any type or style of connector needed to mate to the equipment to be used with the combination signal marker panel and solar panel 100. The solar panel assembly 128 is not limited to one connector 126 or to one type or style of connector 126. Examples of connectors used with the solar panel assembly 128 include circular connectors, barrel connectors, Molex connectors, IEC connectors, fiber optic connectors, rectangular connectors, RF connectors, power connectors (e.g., NEMA sockets and/or plugs), USB, micro USB, mini USB, HDMI, firewire, and lightning. Additionally, a plurality of connectors 126 (of the same type or different types) can be connected to cable or wire 138. In this way, the combination signal marker panel and solar panel 100 can be used to supply multiple devices at the same time, albeit the multiple devices must have substantially the same power requirements. For example, by providing a plurality of connectors 126, the combination signal marker panel and solar panel 100 can be used to charge multiple batteries at the same time or to power multiple pieces of equipment at the same time.

In other embodiments, instead of printing wiring traces 136 on the flexible substrate 134, a discrete flexible wiring harness (not shown) is provided for electrically connecting the solar modules 122 and the connector 126. When the solar panel 120 is assembled, the wiring harness is substantially hidden from view between the first fabric layer 130 and the second fabric layer 132, except for the connector 126 extending outward from one edge.

Figure 5:
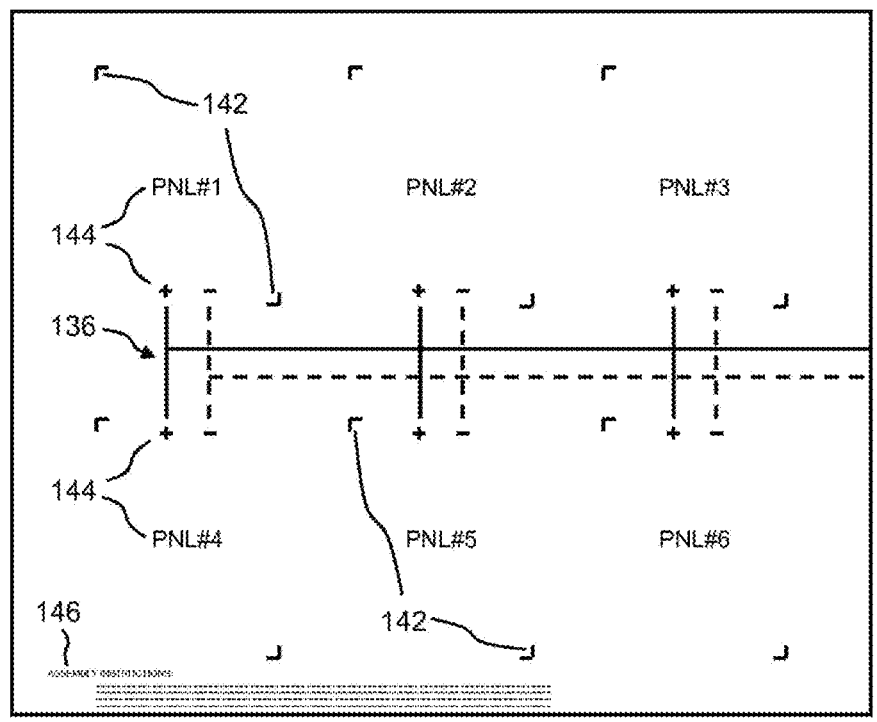
FIG. 5 illustrates a plan view of one embodiment of the substrate of the solar panel of the combination signal marker panel and solar panel.

Because the flexible substrate 134 (e.g., the DuPont™ Tyvek® substrate) of the solar panel 120 is printable, assembly instructions and/or any other markings can be printed thereon for assisting the assembly of the solar modules on the substrate. For example, FIG. 5 illustrates a plan view of the flexible substrate 134 of the solar panel 120 of the presently disclosed combination signal marker panel and solar panel 100. In this example, FIG. 5 shows wiring traces 136 printed on the flexible substrate 134 using, for example, electrically conductive ink. FIG. 5 also shows a set of alignment features 142 that mark the corners of each of the solar modules 122. Additionally, each position of a solar module 122 may have certain text 144 printed thereon, such as PNL#1, PNL#2, PNL#3, PNL#4, PNL#5, and PNL#6, and polarity indicators (+ and −). Further, step-by-step assembly instructions 146 can be printed in any available space on the flexible substrate 134. The alignment features 142, the text 144, and the assembly instructions 146 can be printed using standard permanent ink. Standard printing processes can be used for both the electrically conductive ink and the permanent ink.

Figure 6A:
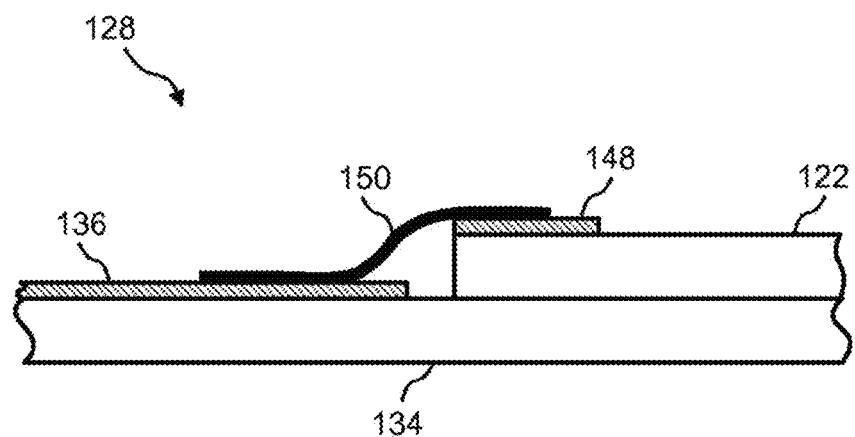
FIG. 6A illustrates a side view of a portion of the solar panel assembly, showing an example of electrically connecting the solar module to the substrate using a conductor.
Figure 6B:
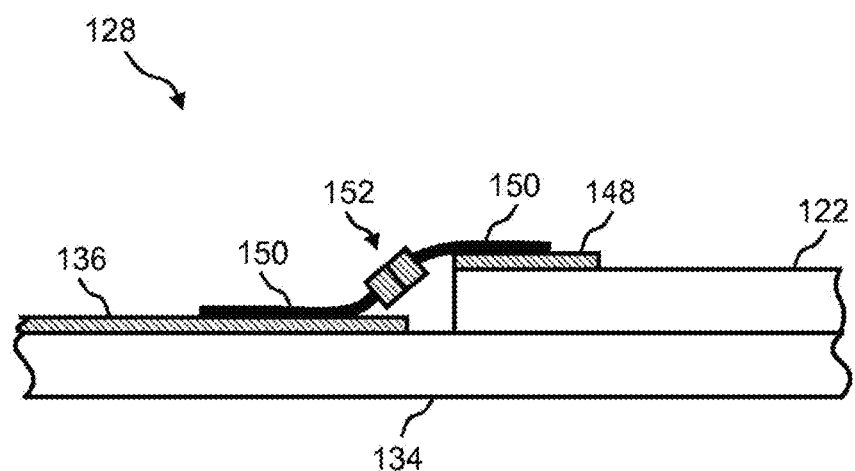
FIG. 6B illustrates a side view of a portion of the solar panel assembly, showing an example of electrically connecting the solar module to the substrate with a connector installed along the length of a conductor.

FIG. 6A and FIG. 6B illustrate side views of a portion of the solar panel 120 assembly, showing two example methods of electrically connecting the solar module 122 to the flexible substrate 134. In one example, FIG. 6A shows an output pad 148 of the solar module 122 in close proximity to a wiring trace 136 on the flexible substrate 134. A conductor 150, such as a flexible conductor, is used to electrically connect the output pad 148 of the solar module 122 to the wiring trace 136. For example, one end of the conductor 150 is soldered to the output pad 148 of the solar module 122 and the other end of the conductor 150 is soldered to the wiring trace 136. In this example, to replace the solar module 122, the conductor 150 is desoldered and removed, the solar module 122 is removed from the flexible substrate 134, a replacement solar module 122 is mounted on the flexible substrate 134, and the conductor 150 is soldered to the output pad 148 of the replacement solar module 122 and the wiring trace 136.

In another example, FIG. 6B shows a connector 152 installed along the length of the conductor 150. In this example, to replace the solar module 122, the connector 152 is disconnected, the solar module 122 is removed from the flexible substrate 134, a replacement solar module 122 is mounted on the flexible substrate 134, and the connector 152 is reconnected.

Figure 7:
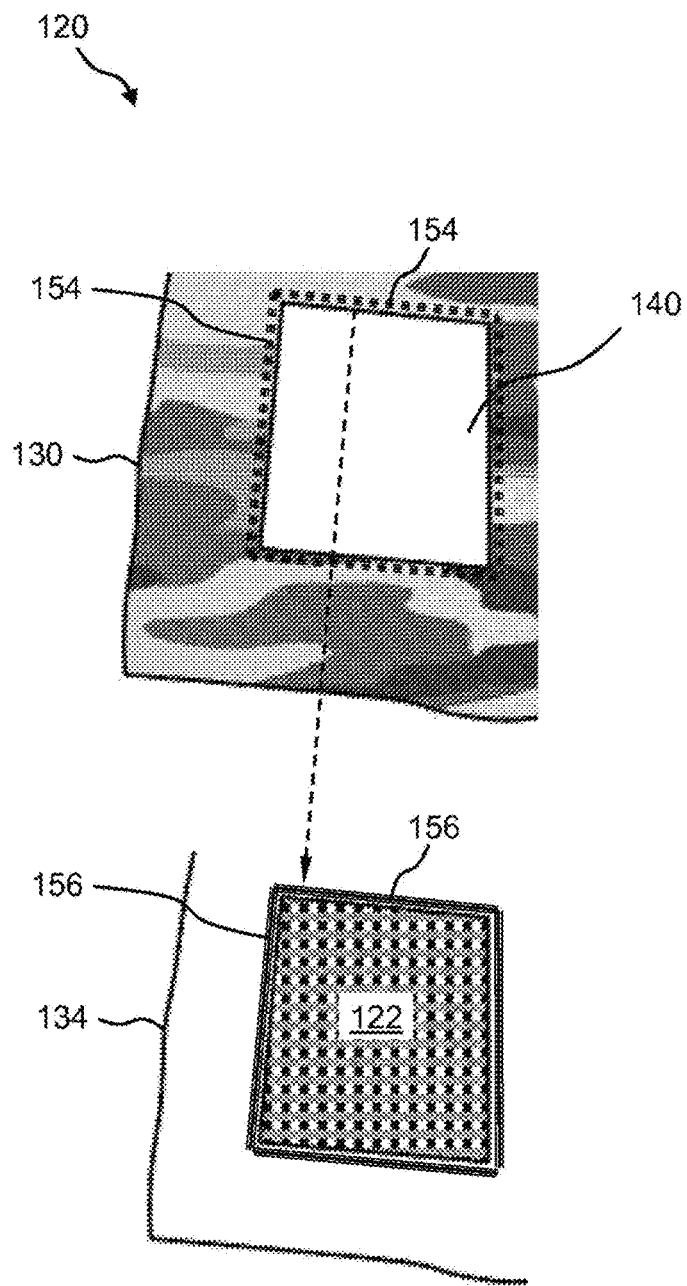
FIG. 7 illustrates a portion of the solar panel of one embodiment of the combination signal marker panel and solar panel, showing a hook-and-loop system for securing the edges of the fabric around the edges of the solar modules.

FIG. 7 illustrates a portion of the solar panel 120 of the presently disclosed combination signal marker panel and solar panel 100, showing a hook-and-loop system for securing the edges of the first fabric layer 130 around the edges of the solar modules 122. By way of example, FIG. 7 shows one window or opening 140 in the first fabric layer 130 and one solar module 122 of the solar panel assembly 128. An arrangement of hook strips 154 is provided on the first fabric layer 130 around the edges of the window or opening 140 and an opposing arrangement of loop strips 156 is provided on the flexible substrate 134 around the edges of solar module 122. In another embodiment, the loop strips 156 are on the first fabric layer 130 and the hook strips 154 are on the flexible substrate 134. The hook strips 154 and the loop strips 156 are, for example, components of a Velcro® hook-and-loop fastening system.

In yet another embodiment, instead of using a hook-and-loop fastening system, stitching is provided around the windows or openings 140, wherein the stitching passes through all of the layers of the solar panel 120 (i.e., through the first fabric layer 130, the flexible substrate 134, and the second fabric layer 132). In this example, however, it must be ensured that the stitching not interfere with any wiring traces 136 on the flexible substrate 134.

The combination signal marker panel and solar panel 100 can include other features. For example, the combination signal marker panel and solar panel 100 can include an elastic band or strap (not shown) that is used for wrapping around the combination signal marker panel and solar panel 100 when folded or rolled. Alternatively, the combination signal marker panel and solar panel 100 can include side release buckles, backpack clips, toggle clips, friction buckles, tongue buckles, quick connect buckles, and/or magnetic closures to secure the combination signal marker panel and solar panel 100 when folded or rolled.

In alternative embodiment, the solar panel 120 is comprised of glass free, flexible thin film solar modules, such as those sold by Flexopower USA (Raleigh, N.C.). The solar modules 122 are comprised of amorphous silicon with triple junction cell architecture. These solar modules 122 continue to deliver power when damaged or perforated. Additionally, these panels provide higher production and a higher output in overcast conditions than comparable glass panels. These panels also provide better performance at a non-ideal angle of incidence.

Figure 8:
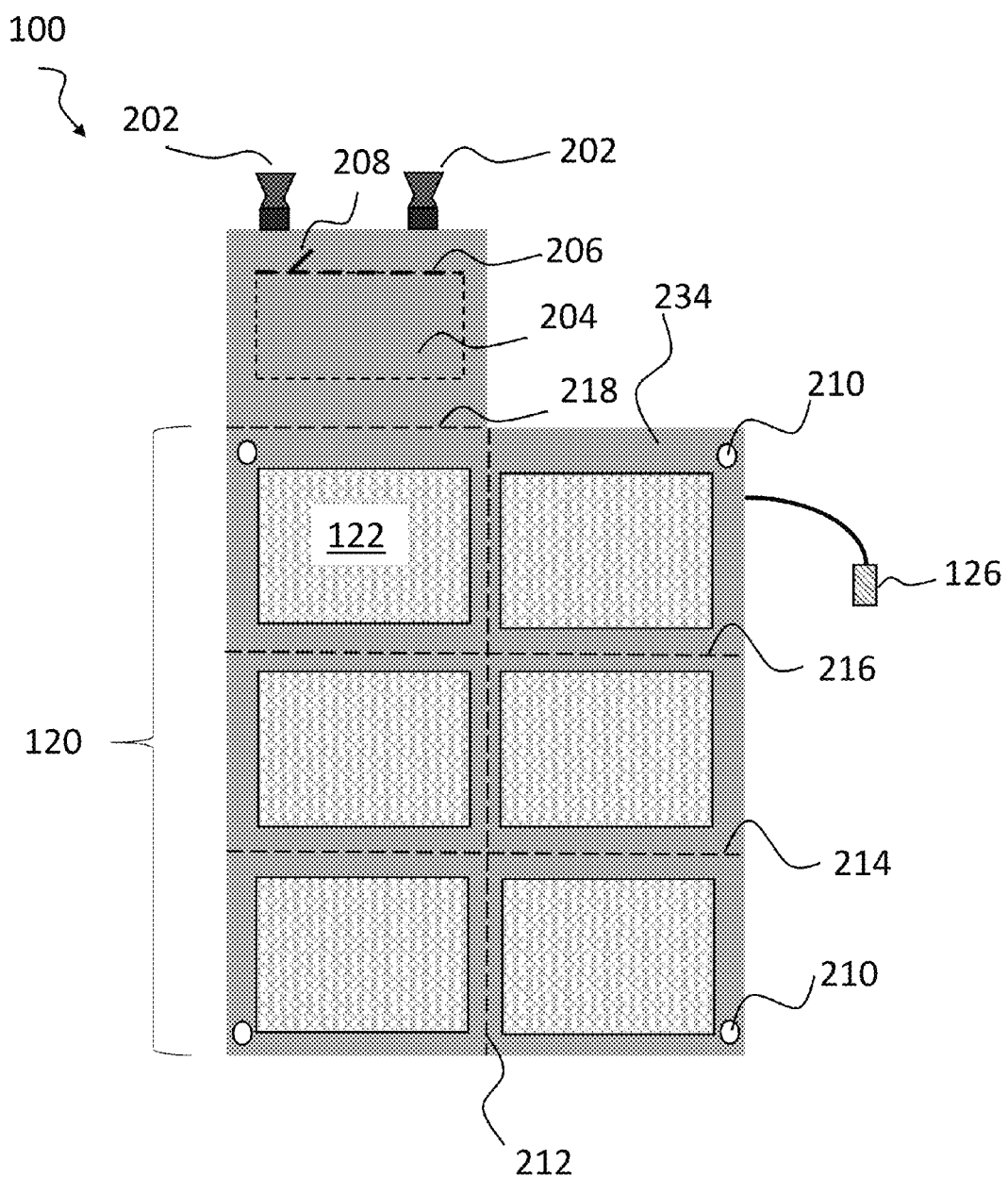
FIG. 8 illustrates a portion of one embodiment of a combination signal marker panel and solar panel made with glass free, thin film solar modules.

FIG. 8 illustrates a portion of a combination signal marker panel and solar panel 100 made with glass free, thin film solar modules. The combination signal marker panel and solar panel 100 includes a plurality, e.g., one or more, of solar modules 122 mounted on a flexible substrate 234. While FIG. 8 shows six solar modules 122 in the solar panel 120, this is exemplary only. The solar panel 120 can include any number of solar modules 122 configured in series, configured in parallel, or configured in any combination of series and parallel arrangements. In particular, the configuration of solar modules 122 in the solar panel 120 can be tailored in any way to provide a certain output voltage and current. The output of any arrangement of solar modules 122 in the solar panel 120 is a direct current (DC) voltage. Accordingly, the solar panel 120 includes at least one output connector 126 that is wired to the arrangement of solar modules 122. The at least one output connector 126 is used for connecting any type of DC load to the solar panel 120. In one example, the solar panel 120 is used for supplying power to a device, such as a DC-powered radio. In another example, the solar panel 120 is used for charging a battery.

The combination signal marker panel and solar panel 100 includes clips 202 (female clip shown) to secure the combination signal marker panel and solar panel 100 when not in use. Further, the combination signal marker panel and solar panel 100 includes an integrated pocket 204 for holding the signal marker panel 110 (not shown) when the solar panel 120 is in use while the signal marker panel 110 is not in use. In this example, the integrated pocket 204 is closed using a zipper 206 and a zipper pull 208. However, the integrated pocket 204 could also be closed using ties, an arrangement of buttons or snaps, or a hook-and-loop fastener system. The solar panel 120 includes eyelets 210, which allows the solar panel to be secured to the ground or another surface. While FIG. 8 shows a total of four eyelets 210 (one in each corner), this is exemplary only. The solar panel 120 can include any number of eyelets 210.

The combination signal marker panel and solar panel 100 has a vertical fold axis 212, a bottom horizontal fold axis 214, a middle horizontal fold axis 216, and a top horizontal fold axis 218.

Figure 9:
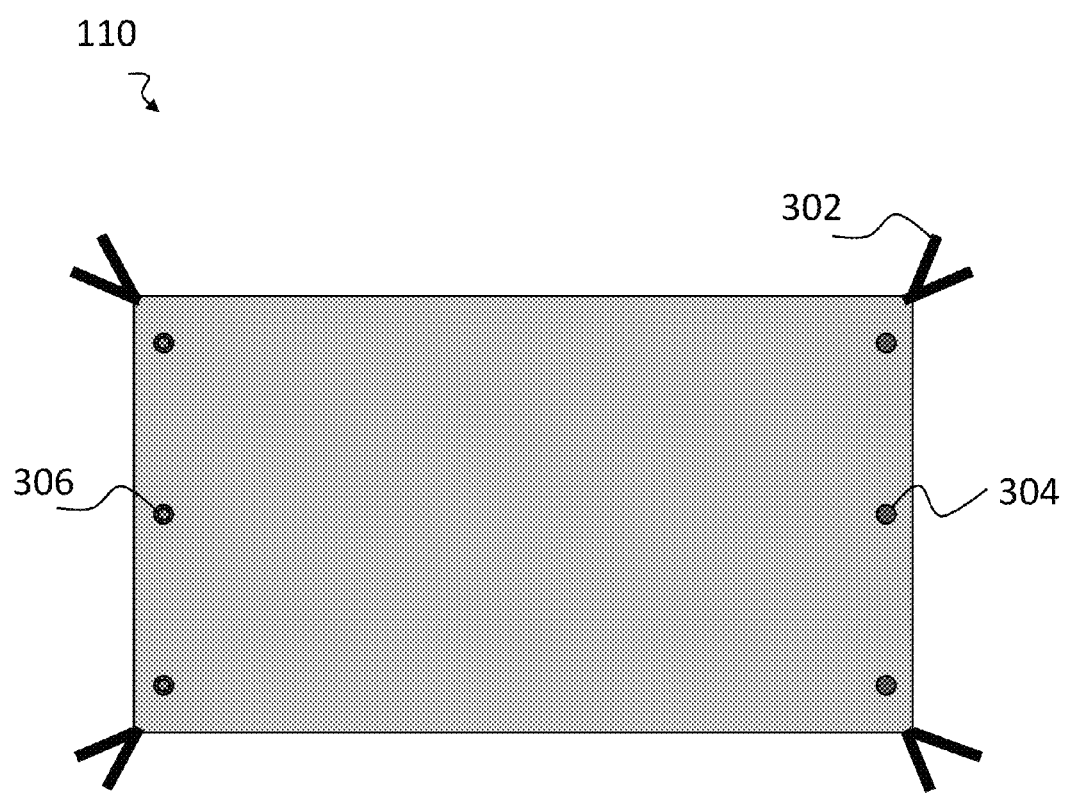
FIG. 9 illustrates one embodiment of a signal marker panel.
Figure 10:
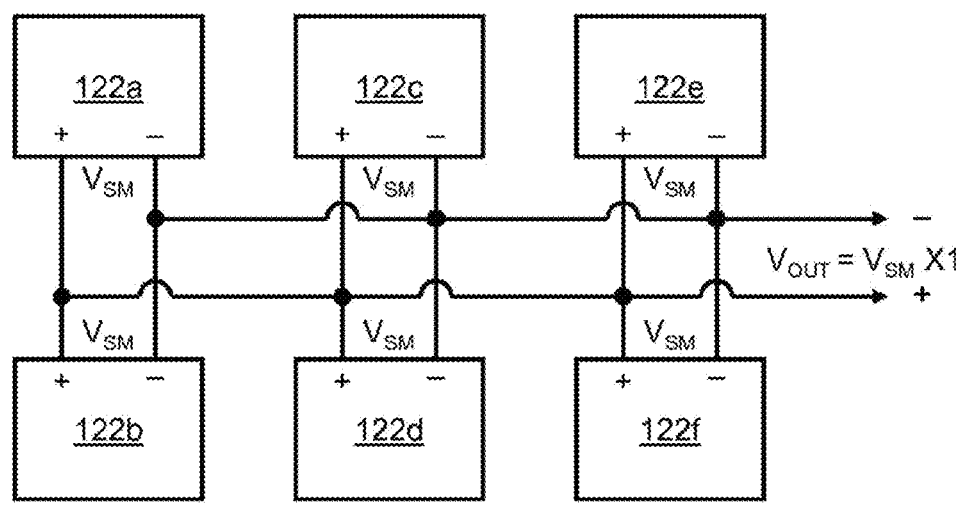
FIG. 10, FIG. 11, FIG. 12, and FIG. 13 show schematic views of examples of configuring the solar modules in the solar panel of the presently disclosed combination signal marker panel and solar panel.
Figure 11:
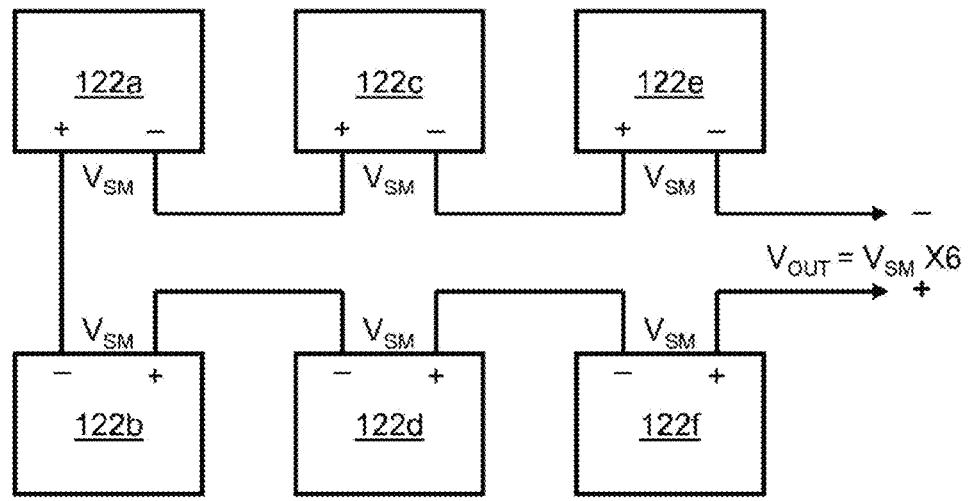
Figure 12:
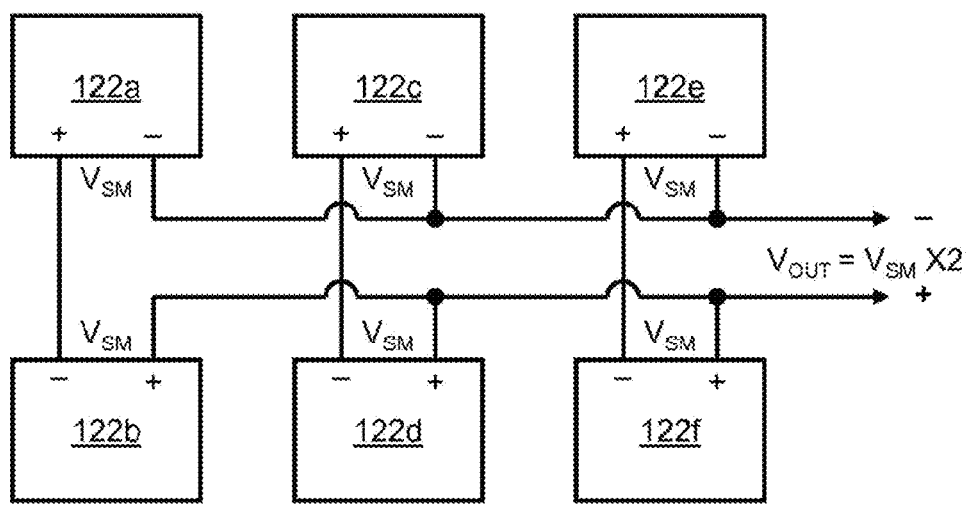
Figure 13:
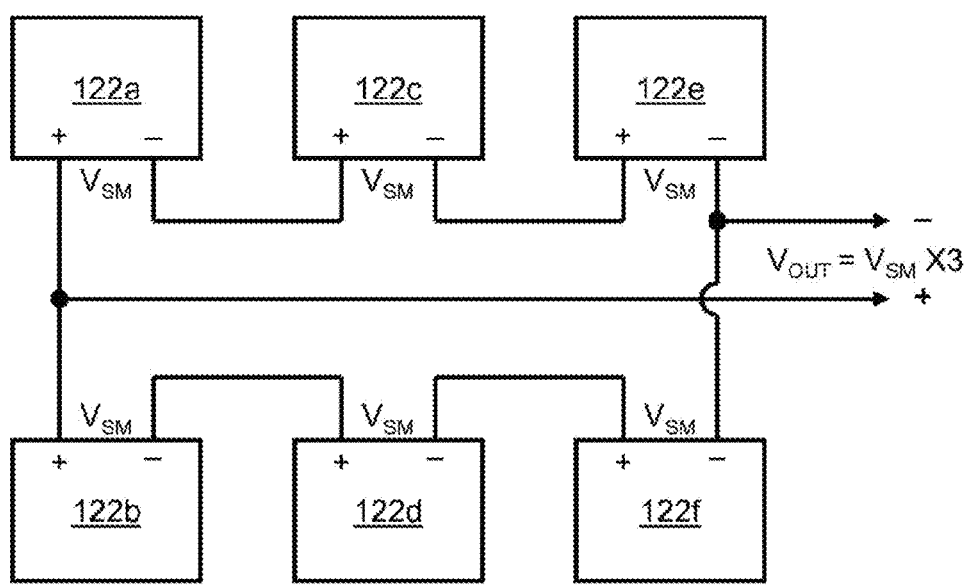

FIG. 9 illustrates one embodiment of a signal marker panel 110. The signal marker panel 110 includes tie straps 302, which allows the signal marker panel 110 to attach to different surfaces (e.g., the ground, trees, a backpack). In one embodiment, the tie straps 302 are made out of the same material as the signal marker panel 110, nylon, elastic, or parachute cord. The signal marker panel 110 includes snaps, which allows multiple signal marker panels 110 to be connected together. The snaps include sockets 304 (cap shown) and studs 306.

Additionally, the combination signal marker panel and solar panel 100 can include features that allow the combination signal marker panel and solar panel 100 to be wearable. The combination signal marker panel and solar panel 100 can be MOLLE-compatible. "MOLLE" means Modular Lightweight Load-carrying Equipment, which is the current generation of load-bearing equipment and backpacks utilized by a number of NATO armed forces. In one embodiment, the combination signal marker panel and solar panel 100 incorporates a pouch attachment ladder system (PALS), which is a grid of webbing used to attach smaller equipment onto load-bearing platforms, such as vests, backpacks, and body armor. The pouch attachment ladder comprises a plurality of straps, a plurality of horizontal rows of webbing, a plurality of slits, and combinations thereof. For example, the PALS grid consists of horizontal rows of 1-inch (2.5 cm) webbing, spaced about one inch apart, and reattached to the backing at 1.5-inch (3.8 cm) intervals.

For example, the combination signal marker panel and solar panel 100 can include features (not shown) that allow it to be worn on the user's back (e.g., such as attached to a backpack), wherein the solar panel 120 portion of the combination signal marker panel and solar panel 100 can be unfurled and exposed to sunlight while the user is hiking. In one embodiment, the combination signal marker panel and solar panel 100 includes a handle for ease of carrying the combination signal marker panel and solar panel 100 when not in use.

In one embodiment, the at least one connector includes one or more connectors that allow a first solar panel to connect to a second solar panel in series or in parallel. This allows a plurality of solar panels 120 of multiple combination signal marker panel and solar panels 100 to be connected together in series or in parallel.

FIG. 10, FIG. 11, FIG. 12, and FIG. 13 show schematic views of examples of configuring the solar modules 122 in the solar panel 120 of the presently disclosed combination signal marker panel and solar panel 100. Again, FIG. 10, FIG. 11, FIG. 12, and FIG. 13 show six solar modules 122, but this is exemplary only. The solar panel 120 can include any number of solar modules 122.

Namely, FIG. 10, FIG. 11, FIG. 12, and FIG. 13 show a first configuration 1000, a second configuration 1100, a third configuration 1200, and a fourth configuration 1300, respectively, wherein each of the configurations includes six solar modules 122. Namely, the configurations 1000, 1100, 1200, and 1300 each include the solar modules 122a, 122b, 122c, 122d, 122e, and 122f. Additionally, each of the solar modules 122a, 122b, 122c, 122d, 122e, and 122f provides substantially the same output voltage ($V_{SM}$).

In the first configuration 1000, the solar modules 122a, 122b, 122c, 122d, 122e, and 122f are connected in parallel. Therefore, using the first configuration 1000, the output voltage ($V_{OUT}$) of the solar panel 120 is $V_{SM} \times 1$. In one example, if $V_{SM}=3$ volts, then $V_{OUT}$ of the solar panel 120=3 volts.

In the second configuration 1100, the solar modules 122a, 122b, 122c, 122d, 122e, and 122f are connected in series. Therefore, using the second configuration 1100, the output voltage ($V_{OUT}$) of the solar panel 120 is $V_{SM} \times 6$. In one example, if $V_{SM}=3$ volts, then $V_{OUT}$ of the solar panel 120=18 volts.

In the third configuration 1200, the solar modules 122a and 122b are connected in series, the solar modules 122c and 122d are connected in series, and the solar modules 122e and 122f are connected in series. Therefore, each series-connected pair of solar modules 122 provides an output voltage of $V_{SM} \times 2$. Then, the three series-connected pairs of solar modules 122 are connected in parallel with each other. Namely, the series-connected pair of solar modules 122a and 122b, the series-connected pair of solar modules 122c and 122d, and the series-connected pair of solar modules 122e and 122f are connected in parallel with each other. Therefore, using the third configuration 1200, the output voltage ($V_{OUT}$) of the solar panel 120 is $V_{SM} \times 2$. In one example, if $V_{SM}=3$ volts, then $V_{OUT}$ of the solar panel 120=6 volts.

In the fourth configuration 1300, the solar modules 122a, 122c, and 122e are connected in series and the solar modules 122b, 122d, and 122f are connected in series. Therefore, each series-connected arrangement of solar modules 122 provides an output voltage of $V_{SM} \times 3$. Then, the two series-connected arrangements of solar modules 122 are connected in parallel with each other. Namely, the series-connected arrangement of solar modules 122a, 122c, and 122e and the series-connected arrangement of solar modules 122b, 122d, and 122f are connected in parallel with each other. Therefore, using the fourth configuration 1300, the output voltage ($V_{OUT}$) of the solar panel 120 is $V_{SM} \times 3$. In one example, if $V_{SM}=3$ volts, then $V_{OUT}$ of the solar panel 120=9 volts.

In the event of failure of one or more solar modules 122 in the solar panel 120, one skilled in the art will recognize that parallel arrangements of the solar modules 122 provide certain advantages over series arrangements of the solar modules 122. For example, if one or more solar modules 122 fail in the first configuration 1000 of FIG. 10, the output voltage ($V_{OUT}$) of the solar panel 120 is not changed, albeit the current capacity is reduced. By contrast, if one solar module 122 fails in the second configuration 1100 of FIG. 11, the output voltage ($V_{OUT}$) of the solar panel 120 is reduced by an amount equal to the $V_{SM}$ of the failing solar module 122.

When configuring the solar modules 122 in the solar panel 120 of the combination signal marker panel and solar panel 100, another consideration of the size, number, and placement of the solar modules 122 on the flexible substrate 134 is the foldability of the combination signal marker panel and solar panel 100. Namely, providing enough space between solar modules 122 to allow the combination signal marker panel and solar panel 100 to be folded.

Referring now to FIG. 14, FIG. 15, FIG. 16, and FIG. 17, an exemplary process of folding the combination signal marker panel and solar panel 100 shown in FIG. 1 and FIG. 2 that includes six solar modules 122 is presented. The folding process depends on the configuration of solar modules 122 in the combination signal marker panel and solar panel 100 and can differ from one configuration to another.

Figure 14:
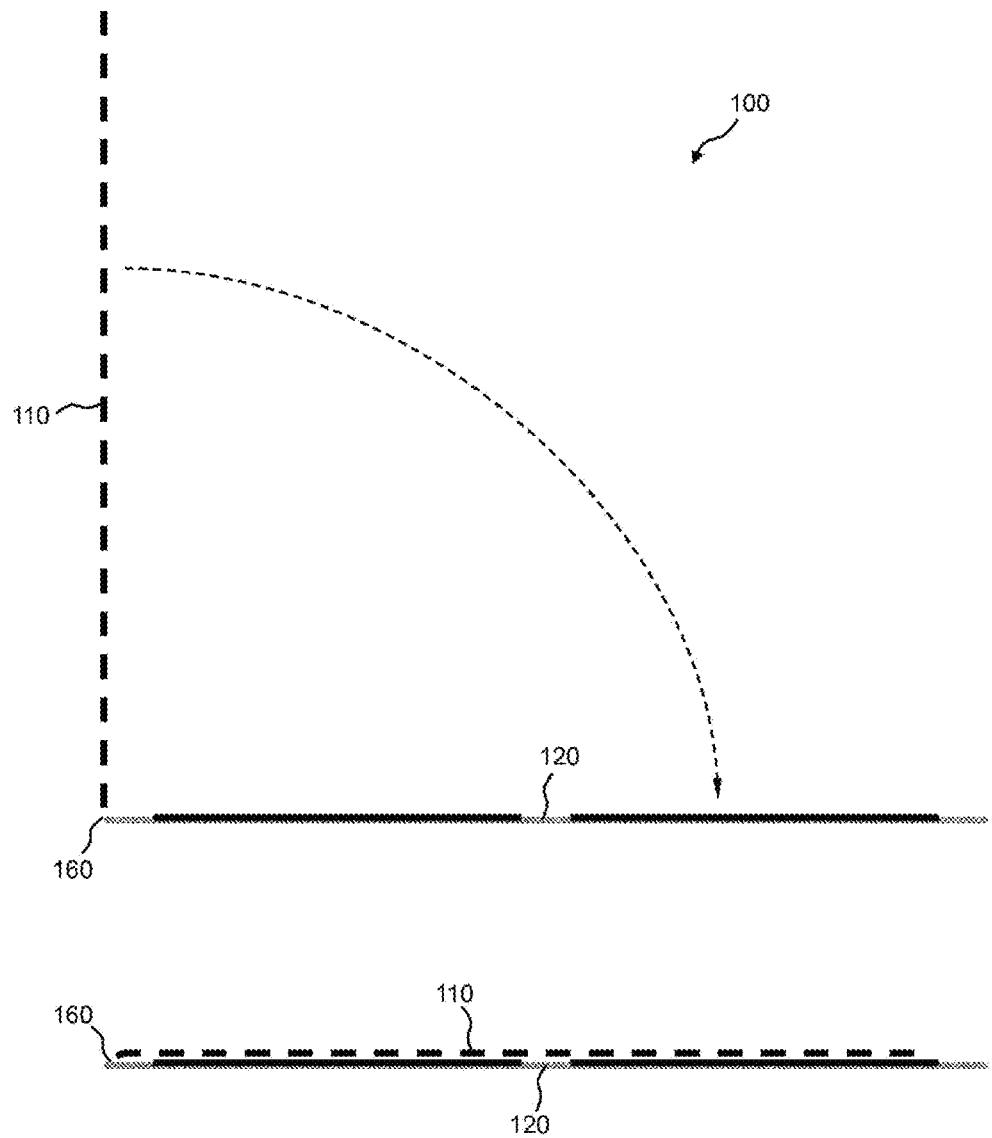
FIG. 14, FIG. 15, FIG. 16, and FIG. 17 show a process of folding the embodiment of the combination signal marker panel and solar panel shown in FIG. 1.

In a first step and referring now to FIG. 14, the edge of the signal marker panel 110 that is farthest from the solar panel 120 is drawn across the solar panel 120 and toward the edge of the solar panel 120 that is farthest from the signal marker panel 110. In this way, a fold 160 is formed in the portion of the combination signal marker panel and solar panel 100 where the signal marker panel 110 and the solar panel 120 are joined together. By drawing the signal marker panel 110 over the surface of the solar panel 120, the signal marker panel 110 provides protection to the solar modules 122 when the combination signal marker panel and solar panel 100 is folded and stowed.

Figure 15:
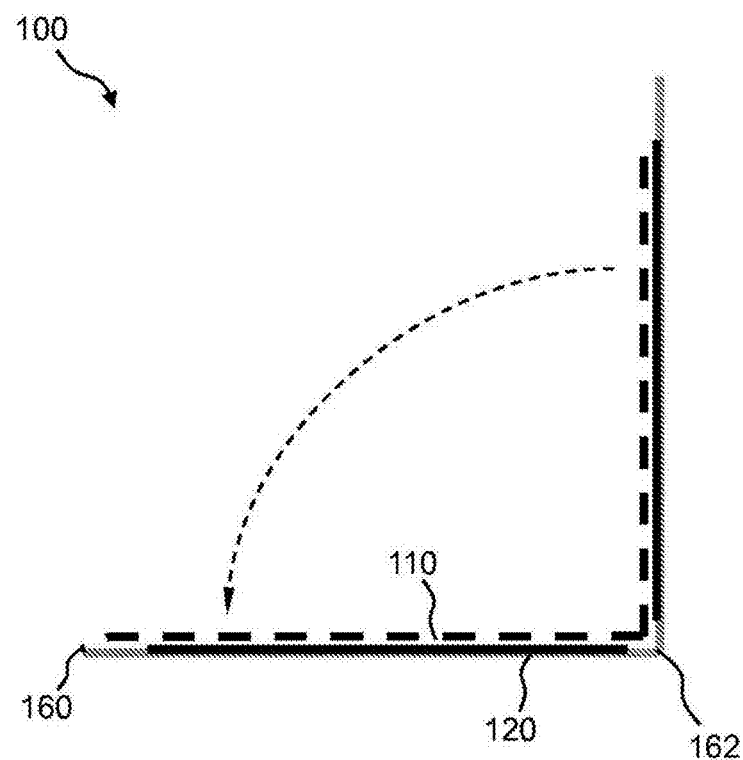
Figure 15:
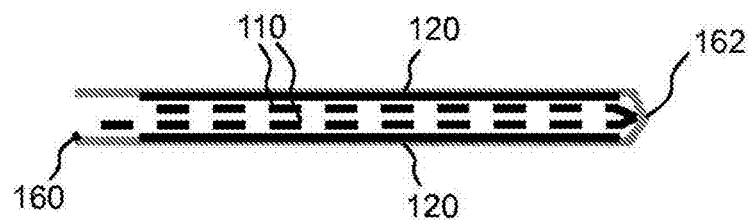

In a next step and referring now to FIG. 15, a fold 162 is formed at about the midway point of the solar panel 120, which is between two sets of solar modules 122.

Figure 16:
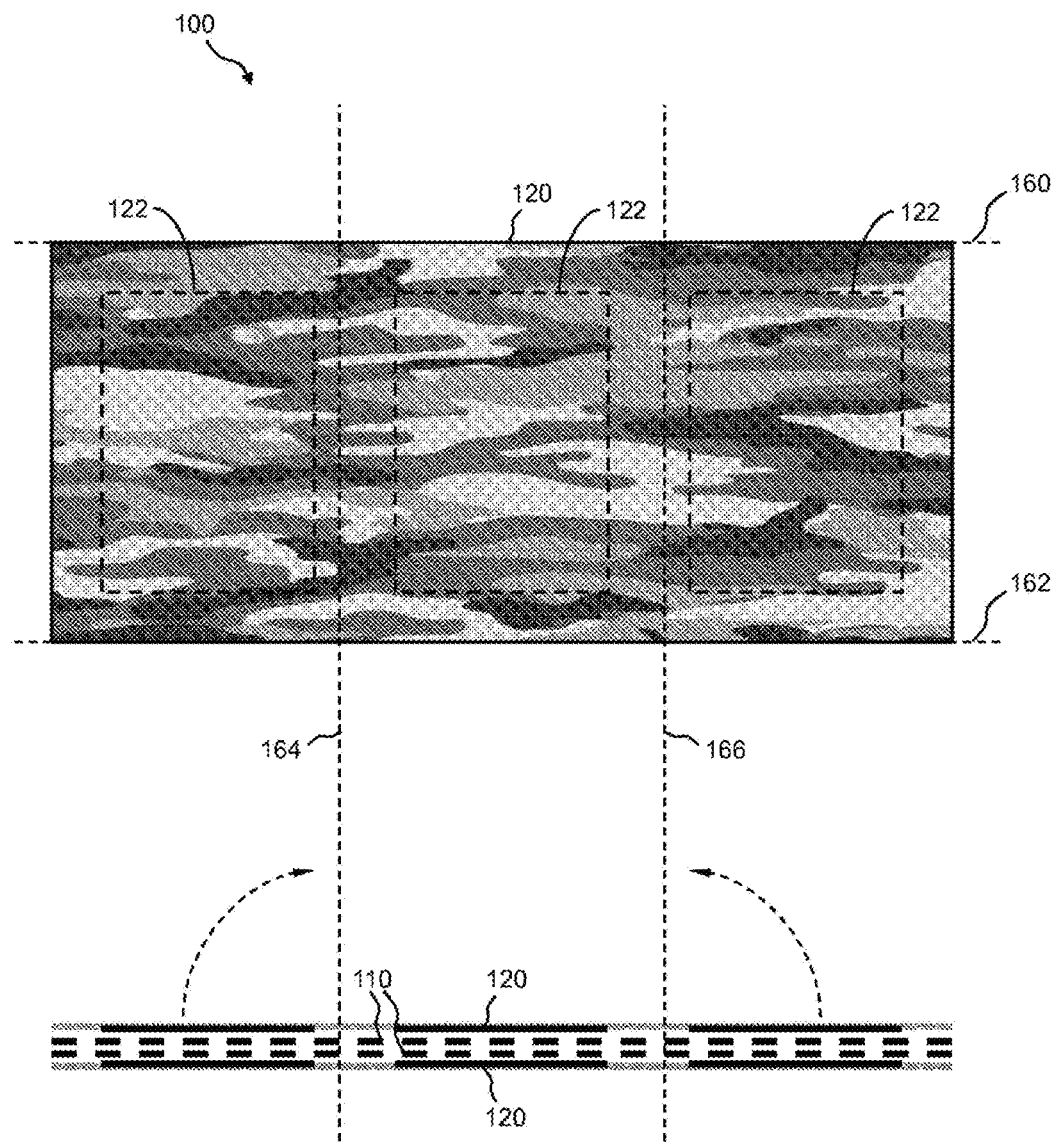
Figure 17:
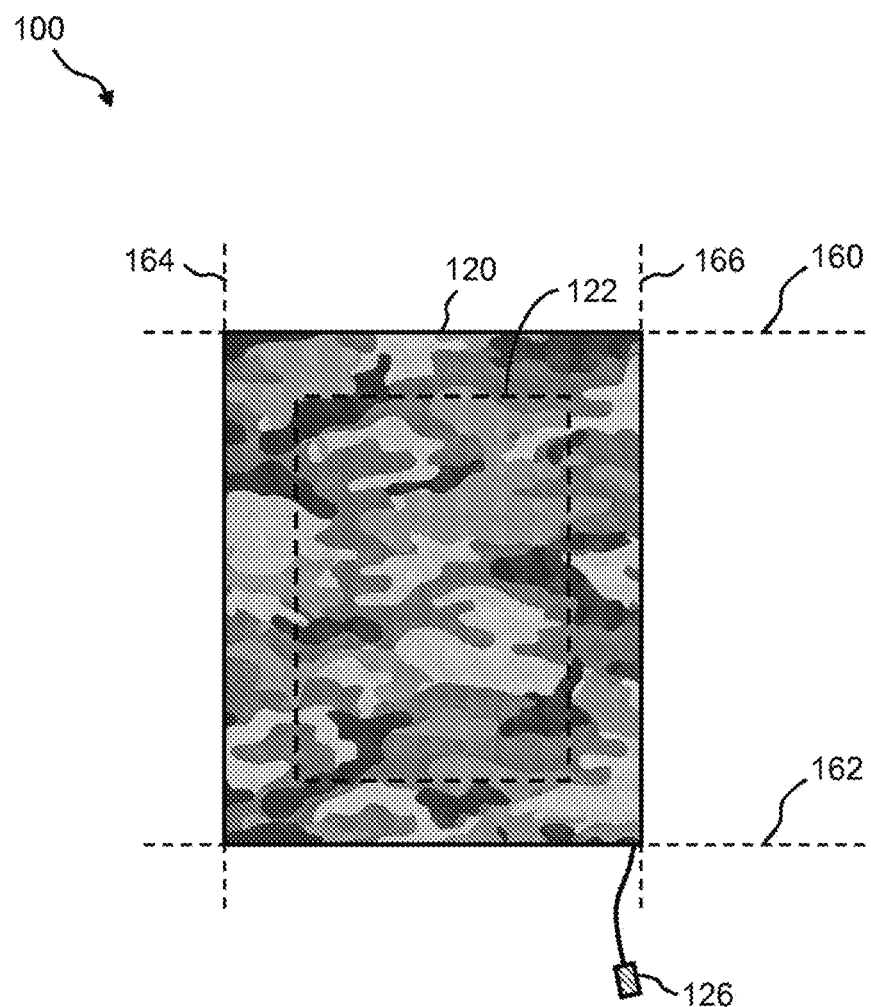

In a next step and referring now to FIG. 16, a first fold 164 and a second fold 166 are formed such that the outer solar modules 122 are collapsed toward the inner solar modules 122. The result of the folding process is shown in FIG. 17, wherein the folded combination signal marker panel and solar panel 100 is about one sixth the size of the unfolded solar panel 120. Once folded, an elastic band or strap (not shown) can be wrapped around the folded combination signal marker panel and solar panel 100.

Figure 18:
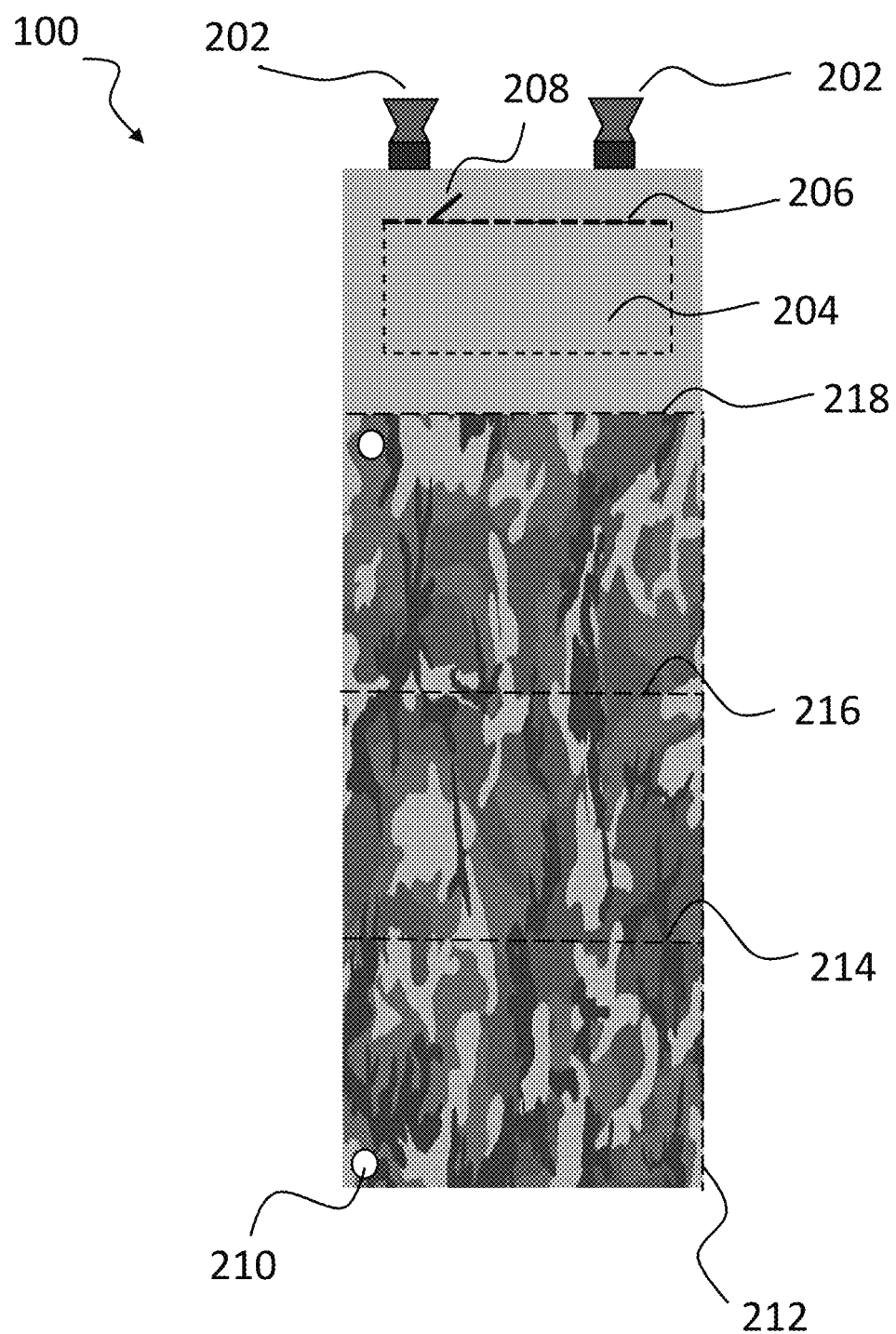
FIG. 18 and FIG. 19 show a process of folding the embodiment of the combination signal marker panel and solar panel shown in FIG. 8.
Figure 19:
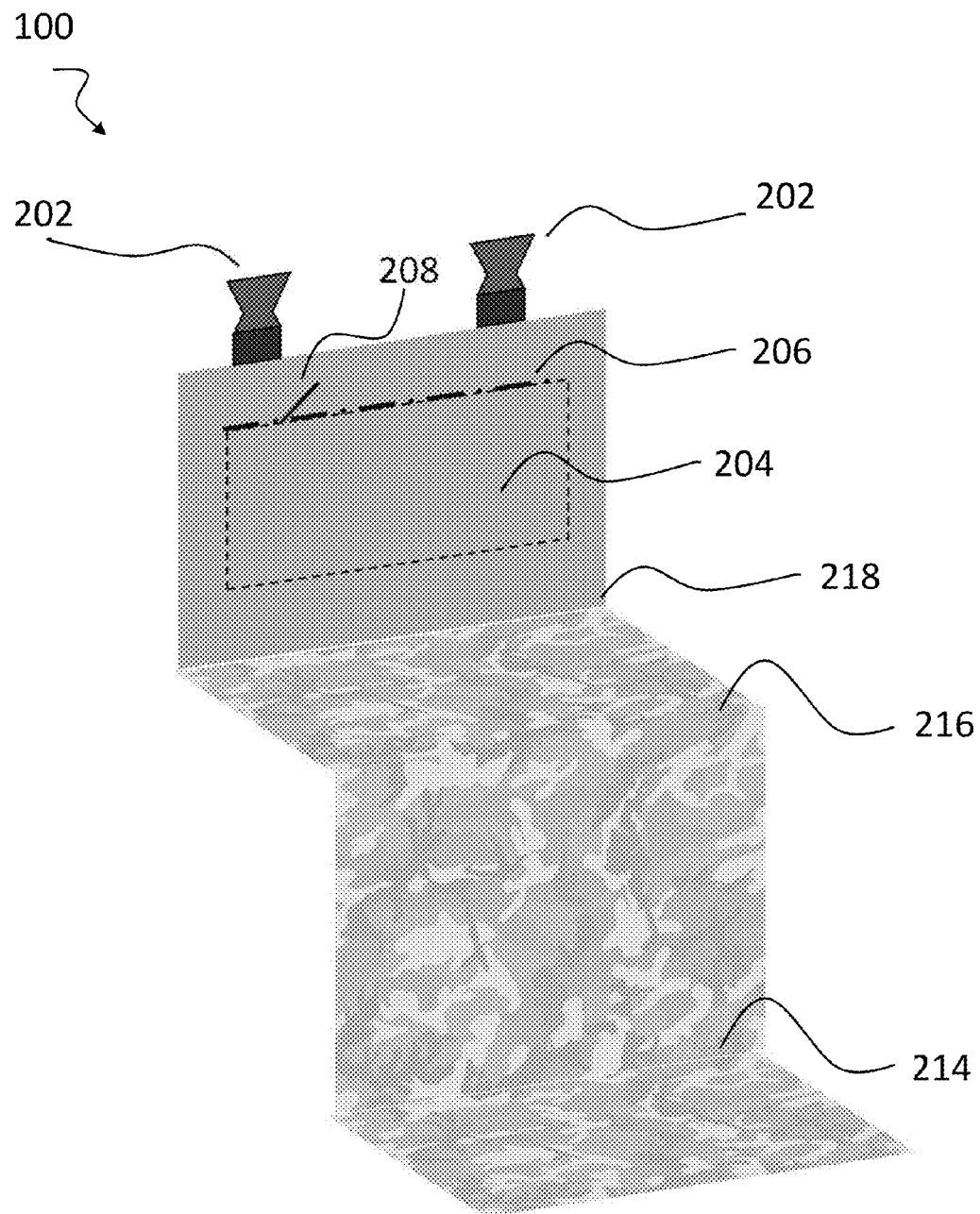

Referring now to FIG. 18 and FIG. 19, a process of folding the combination signal marker panel and solar panel 100 shown in FIG. 8 that includes six solar modules 122 is presented. This folding process, however, is exemplary only. The folding process depends on the configuration of solar modules 122 in the combination signal marker panel and solar panel 100 and can differ from one configuration to another.

In a first step and referring now to FIG. 18, the edge of the solar panel 120 is folded along the vertical fold axis 212. The combination signal marker and solar panel 100 is then folded at the bottom horizontal fold axis 214, the middle horizontal fold axis 216, and the top horizontal fold axis 218 to form an accordion shape. The combination signal marker and solar panel 100 is then secured using the clips 202 (female clip shown).

Figure 20:
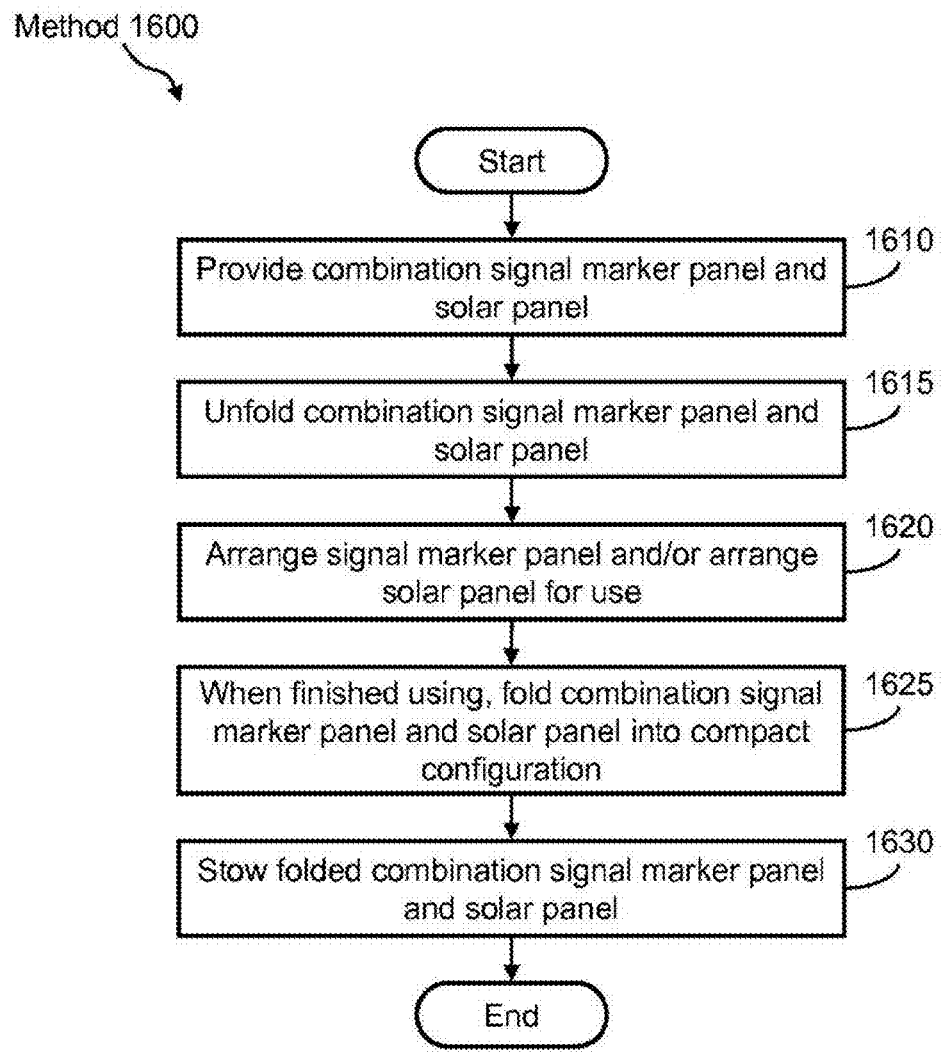
FIG. 20 illustrates a flow diagram of an example of a method of deploying the presently disclosed combination signal marker panel and solar panel.

FIG. 20 illustrates a flow diagram of an example of a method 1600 of deploying the presently disclosed combination signal marker panel and solar panel 100. The method 1600 may include, but is not limited to, the following steps.

At a step 1610, the combination signal marker panel and solar panel 100 is provided.

At a step 1615, the user unfolds the combination signal marker panel and solar panel 100.

At a step 1620, the user arranges the signal marker panel 110 and/or the solar panel 120 of the combination signal marker panel and solar panel 100 for use. In one example, the signal marker panel 110 is laid out to be visible to anyone in the vicinity thereof while the position of the solar panel 120 is not important to the user. In another example, the solar panel 120 is laid out to harvest solar energy while the position of the signal marker panel 110 is not important to the user. In one embodiment, a pocket is provided in the combination signal marker panel and solar panel 100 for holding the signal marker panel 110 when the solar panel 120 is in use. In yet another example, the signal marker panel 110 is laid out to be visible to anyone in the vicinity thereof and, at the same time, the solar panel 120 is laid out to harvest solar energy.

In still another example, the combination signal marker panel and solar panel 100 can include features that allow the combination signal marker panel and solar panel 100 to be wearable. For example, the combination signal marker panel and solar panel 100 can include features that allow it to be worn on the user's back (e.g., such as attached to a backpack), wherein the solar panel 120 portion of the combination signal marker panel and solar panel 100 can be unfurled and exposed to sunlight while the user is hiking.

At a step 1625, when the user is finished deploying the combination signal marker panel and solar panel 100, the user folds the combination signal marker panel and solar panel 100 into a compact configuration. In one example, the user folds the combination signal marker panel and solar panel 100 according to the example folding process shown in FIG. 14, FIG. 15, FIG. 16, and FIG. 17 or FIG. 18 and FIG. 19.

At a step 1630, the user stows the folded combination signal marker panel and solar panel 100. In one example, the user stows the folded combination signal marker panel and solar panel 100 in his/her backpack.

Referring now to FIG. 1 through FIG. 20 in one example application—a military application, the combination signal marker panel and solar panel 100 provides the following advantages over using separate signal marker panels and solar panels:

1) The combination signal marker panel and solar panel 100 can be used to harvest solar energy while simultaneously marking the user's position to friendlies in the battle space, both on the ground and in the air.

2) The combination signal marker panel and solar panel 100 has a small footprint that allows it to be draped over the user's backpack or rucksack, which allows the solar panel 120 portion to be used while on the move.

3) The small footprint of the combination signal marker panel and solar panel 100 facilitates stationary charging in tight spaces, and makes the overall folded or rolled dimension light enough and small enough to be carried by the user instead of the user carrying additional batteries.

Following long-standing patent law convention, the terms "a," "an," and "the" refer to "one or more" when used in this application, including the claims. Thus, for example, reference to "a subject" includes a plurality of subjects, unless the context clearly is to the contrary (e.g., a plurality of subjects), and so forth.

Throughout this specification and the claims, the terms "comprise," "comprises," and "comprising" are used in a non-exclusive sense, except where the context requires otherwise. Likewise, the term "include" and its grammatical variants are intended to be non-limiting, such that recitation of items in a list is not to the exclusion of other like items that can be substituted or added to the listed items.

For the purposes of this specification and appended claims, unless otherwise indicated, all numbers expressing amounts, sizes, dimensions, proportions, shapes, formulations, parameters, percentages, parameters, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some embodiments, ±100% in some embodiments ±50%, in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed methods or employ the disclosed compositions.

Further, the term "about" when used in connection with one or more numbers or numerical ranges, should be understood to refer to all such numbers, including all numbers in a range and modifies that range by extending the boundaries above and below the numerical values set forth. The recitation of numerical ranges by endpoints includes all numbers, e.g., whole integers, including fractions thereof, subsumed within that range (for example, the recitation of 1 to 5 includes 1, 2, 3, 4, and 5, as well as fractions thereof, e.g., 1.5, 2.25, 3.75, 4.1, and the like) and any range within that range.

Although the foregoing subject matter has been described in some detail by way of illustration and example for purposes of clarity of understanding, it will be understood by those skilled in the art that certain changes and modifications can be practiced within the scope of the appended claims.

The invention claimed is:

1. A combination signal marker panel and solar panel comprising:
   a signal marker panel; and
   a solar panel;
   wherein the solar panel comprises one or more solar modules;
   wherein the one or more solar modules are mounted to a flexible substrate and are electrically connected to one another and to at least one output connector;
   wherein a first layer of fabric and a second layer of fabric are positioned on a top and a bottom of the flexible substrate;
   wherein at least one of the first layer of fabric and the second layer of fabric comprises one or more openings;
   wherein the one or more openings have one or more dimensions substantially equivalent to one or more dimensions of the one or more solar modules;
   wherein the flexible substrate comprises flashspun high-density polyethylene; and wherein the signal marker panel is detachably secured to and separable from the solar panel.

2. The combination signal marker panel and solar panel of claim 1, wherein the signal marker panel is detachably secured to the solar panel by a fastening mechanism selected from the group consisting of a zipper, one or more buttons or snaps, a hook-and-loop system, and combinations thereof.

3. The combination signal marker panel and solar panel of claim 1, wherein the one or more solar modules includes at least two solar modules, and wherein the at least two solar modules are electrically connected to one another in a configuration selected from the group consisting of series, parallel, or combinations thereof.

4. The combination signal marker panel and solar panel of claim 1, wherein the one or more solar modules are electrically connected by one or more electrical traces printed on the flexible substrate.

5. The combination signal marker panel and solar panel of claim 1, wherein the signal marker panel comprises a material selected from the group consisting of a polyester, a polyvinylchloride-coated polyester, a vinyl-coated polyester, nylon, canvas, polyvinyl chloride-coated canvas, and polycotton canvas.

6. The combination signal marker panel and solar panel of claim 1, wherein the first layer of fabric and the second layer of fabric are waterproof or water resistant.

7. The combination signal marker panel and solar panel of claim 1, wherein the first layer of fabric and the second layer of fabric each independently comprise a material selected from the group consisting of a polyester, a polyvinylchloride-coated polyester, a vinyl-coated polyester, nylon, canvas, polyvinyl chloride-coated canvas, and polycotton canvas.

8. The combination signal marker panel and solar panel of claim 1, wherein the flexible substrate further comprises instructions printed thereon.

9. The combination signal marker panel and solar panel of claim 1, wherein the signal marker panel can be positioned to provide secondary protection to the solar panel when stowed.

10. The combination signal marker panel and solar panel of claim 1, further comprising an integrated pocket for securing the signal marker panel when not in use.

11. The combination signal marker panel and solar panel of claim 1, wherein the combination signal marker panel and solar panel is Modular Lightweight Load-carrying Equipment (MOLLE)-compatible.

12. The combination signal marker panel and solar panel of claim 1, wherein the signal marker panel and/or the solar panel includes tie straps, loops, eyelets, and/or grommets.

13. The combination signal marker panel and solar panel of claim 1, wherein the at least one output connector includes one or more connectors that allow a first solar panel to connect to a second solar panel in series or in parallel.

14. The combination signal marker panel and solar panel of claim 1, wherein the signal marker panel includes snaps that allow a first signal marker panel to connect to a second signal marker panel.

15. The combination signal marker panel and solar panel of claim 1, wherein the signal marker panel incorporates reflective material, thermal identification material, and/or a U.S. Coast Guard-approved distress signal.

* * * * *